United States Patent [19]
Kusonose et al.

[11] Patent Number: 5,296,917
[45] Date of Patent: Mar. 22, 1994

[54] METHOD OF MONITORING ACCURACY WITH WHICH PATTERNS ARE WRITTEN

[75] Inventors: Haruhiko Kusonose; Hidehiko Kozawa, both of Itami, Japan

[73] Assignee: Mitsubishi Denki Kabushiki Kaisha, Tokyo, Japan

[21] Appl. No.: 822,900

[22] Filed: Jan. 21, 1992

[30] Foreign Application Priority Data

Jan. 21, 1992 [JP] Japan .................................. 3-19147

[51] Int. Cl.⁵ .............................................. G01B 11/00
[52] U.S. Cl. .................................. 356/401; 250/492.2
[58] Field of Search .................... 356/394, 400, 401; 355/53; 250/492.2, 492.22

[56] References Cited

U.S. PATENT DOCUMENTS 4,774,461 9/1988 Matsui et al. ...................... 356/394
5,017,514 5/1991 Nishimoto ........................... 356/401

FOREIGN PATENT DOCUMENTS 59-105647 6/1984 Japan .
62-263633 11/1987 Japan .

*Primary Examiner*—Richard A. Rosenberger
*Attorney, Agent, or Firm*—Leydig, Voit & Mayer

[57] ABSTRACT

A method of monitoring the accuracy with which patterns are written includes the steps of: disposing in an exposure zone a monitor pattern zone for monitoring accuracy; partitioning the monitor pattern zone into a plurality of fields so that the fields overlap each other; forming checking patterns where the plurality of fields overlap each other; and measuring an alignment accuracy in the checking patterns by exposing the plurality of fields to an electron beam and inspecting the exposed field.

3 Claims, 6 Drawing Sheets

METHOD OF MONITORING ACCURACY WITH WHICH PATTERNS ARE WRITTEN

BACKGROUND OF THE INVENTION

1. Field of the Invention

The present invention relates to a method of monitoring the accuracy with which a photomask is transferred or the accuracy with which a pattern is directly written onto a wafer, the photomask and the wafer being used for manufacturing semiconductor devices.

2. Description of the Related Art

When semiconductor devices such as ICs are manufactured, a photo-lithography technique is used to form patterns. As the degree of integration of semiconductor devices has increased in recent years, manufacturing processes for semiconductor devices have become complex, and there has been a demand that accuracy of photomasks, such as pattern accuracy and overlay accuracy, be improved. For this reason, an electron beam exposure system has been employed which easily processes patterns and is capable of rapidly and highly accurately forming patterns on a photomask. Various types of electron beam exposure systems have been employed. Instead of an exposure system using a conventional spot beam raster scan method, an exposure system using a variable shaped beam vector scan method has been employed, which method can form patterns more accurately than the conventional method.

An exposure method based on the variable shaped beam vector scan method will now be described. As shown in FIG. 9, a photomask 21 has a plurality of chip portions 23. Each chip portion 23 is partitioned into small zones or fields 30 of a predetermined size, as depicted in FIG. 10. The small zones 30 in the chip portions 23 are exposed one after another, and thus all of the chip portions 23 are exposed, whereby the entire surface of the photomask 21 is consequently patterned.

As shown in FIG. 11, each field 30 is partitioned further into small zones or shots 31. The chip portions 23 are exposed shot-by-shot. Each field 30 is usually partitioned into rectangular shots 32, however, a trapezoidal FIG. 33 may also be formed due to an oblique pattern or other factors. In such a case, to precisely form the oblique portion of the trapezoidal FIG. 33, as shown in FIG. 12, the trapezoidal FIG. 33 is partitioned further into small rectangular shots 34, which are exposed one by one so that a part of one rectangular shot 34 is overlapped by a part of another rectangular shot 34.

Thus, pattern data in one chip portion 23 is divided into a large number of fields 30, and pattern data in one field 30 is further divided into a large number of shots 31. These fields 30 and shots 31 are then exposed. For this reason, the stitching accuracy between adjacent fields 30 within each chip portion 23 and the dimensional accuracy of patterns within the fields 30 in which the shots 31 are combined, become crucial to the operation of electron beam exposure systems. Thus it is required to maintain these accuracies at a level which is as high as possible.

However, because there has hitherto been no method of measuring and inspecting the accuracy with which patterns are written (hereinafter referred to as a writing accuracy), it is difficult to control pattern formation with high accuracy, thus making it difficult to improve the yield of products.

SUMMARY OF THE INVENTION

The present invention has been made to solve such a problem of the conventional art. Accordingly, the object of this invention is to provide a method of monitoring the writing accuracy of patterns in which accuracy is easily inspected.

In order to achieve the above object, there is provided a method of monitoring the accuracy with which patterns are written comprising the steps of: disposing in an exposure zone a monitor pattern zone for monitoring accuracy; partitioning the monitor pattern zone into a plurality of fields so that the fields overlap each other; forming checking patterns where the plurality of fields overlap each other; and measuring alignment accuracy in the checking patterns already written by exposing the plurality of fields.

DESCRIPTION OF THE PREFERRED EMBODIMENTS

The embodiments of the present invention will be described below with reference to the accompanying drawings.

Figure 1:
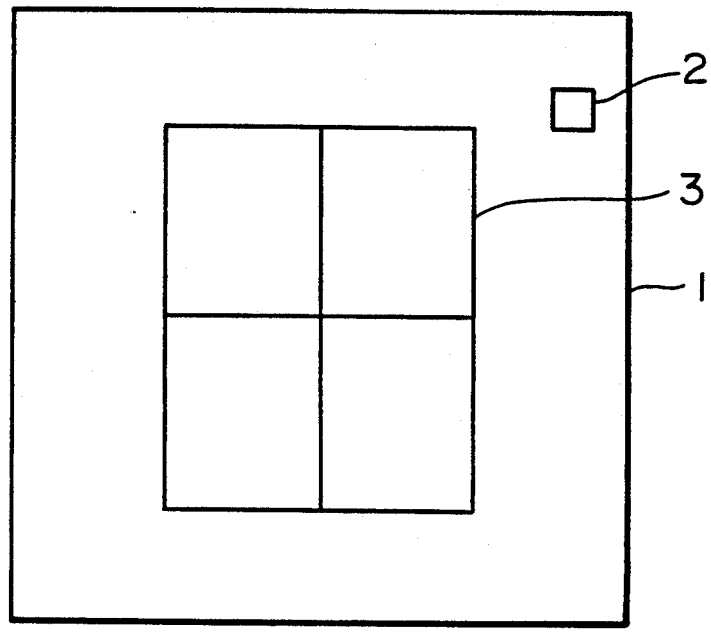
FIG. 1 is a plan view showing a photomask created by a method of monitoring the accuracy with which patterns are written according to an embodiment of the present invention.
Figure 2:
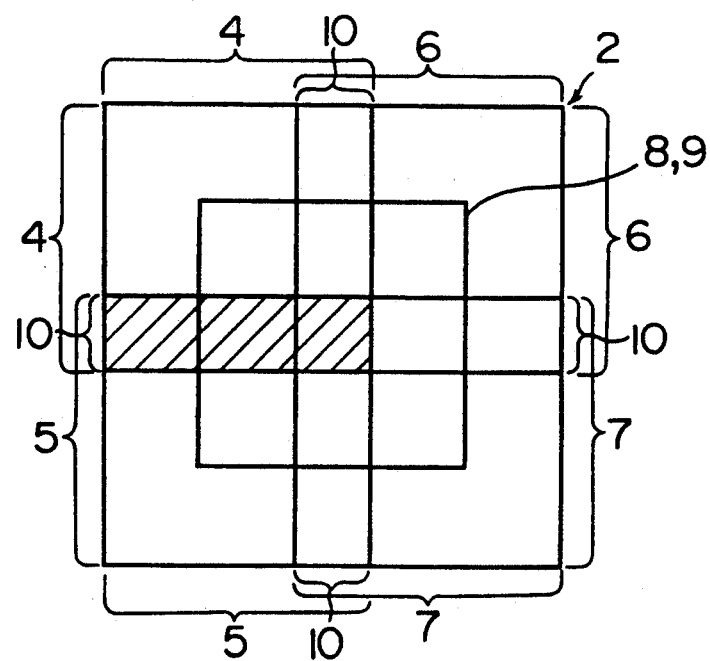
FIG. 2 is an enlarged view showing a monitor pattern zone disposed on the photomask of FIG. 1.

FIG. 1 is a plan view showing a photomask created by a method of monitoring the accuracy with which patterns are written according to an embodiment of the invention. This accuracy is hereinafter called writing accuracy). First, a plurality of chip portions 3 serving as a main pattern are arranged on the surface of a photomask 1, for example, a glass plate. A monitor pattern zone 2 for monitoring accuracy is also disposed on the photomask 1 spaced from the chip portions 3. Next, as shown in FIG. 2, the monitor pattern zone 2 is divided into six fields 4 to 9. Each of the fields 4 to 7 has an overlap portion 10 in which a part of one field is overlapped by another field. For instance, a shaded portion in FIG. 2 indicates where the fields 4 and 5 overlap each other. The fields 8 and 9 are both disposed at the center of the monitor pattern zone 2 so that these fields 8 and 9 completely overlap each other, and are also overlapped by a part of each of the other fields 4 to 7.

Figure 3:
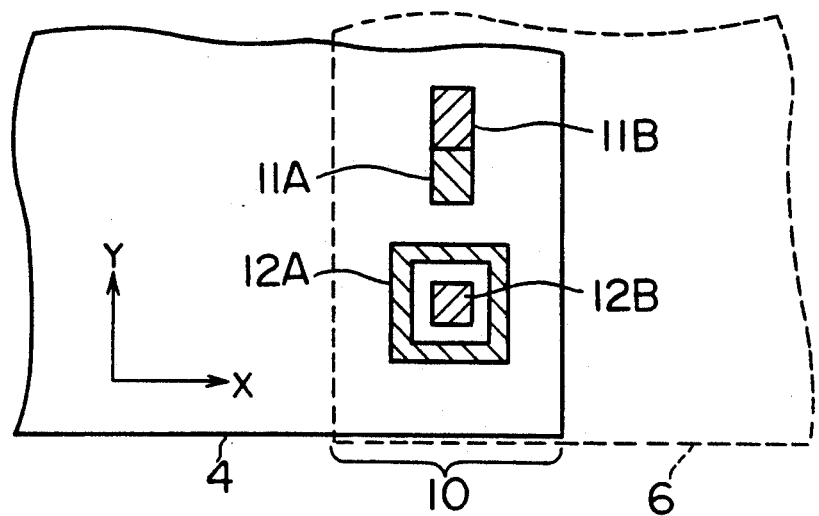
FIG. 3 is a plan view showing an example of a checking pattern disposed on the monitor pattern zone.

A checking pattern is formed in each overlap portion 10 of the respective fields 4 to 9. Various checking patterns may be employed. As shown in FIG. 3, rectangular checking patterns 11A and 11B of the same size are formed in the fields 4 and 6, respectively, and contact each other in the overlap portion 10 in which the fields 4 and 6 overlap each other.

After data regarding the checking patterns 11A and 11B has been created, a series of electron beam exposures write the checking patterns 11A and 11B together with the main pattern in the chip portions 3. By observing how the checking patterns 11A and 11B are joined together, it is possible to qualitatively inspect the alignment accuracy in the position in which the field 4 is connected to the field 6 (hereinafter referred to simply as the connecting position). The writing accuracy for the main pattern formed in the same process as that used for the checking patterns 11A and 11B is determined based on the results of the inspection. The closer the two checking patterns 11A and 11B are joined together, the higher the alignment accuracy in the connecting position (where the fields 4 and 6 are connected to each other. Thus a determination is made that the writing accuracy for the main pattern is high.

Instead of or in addition to the checking patterns 11A and 11B, as shown in FIG. 3, a square-like checking pattern 12A is formed in the field 4, and a rectangular checking pattern 12B is disposed so that it lies at the center of the square-like checking pattern 12A is formed in the field 6. After the patterns 12A and 12B have been written, the length of the gap between the left-hand portion of the pattern 12A and the pattern 12B is measured with respect to an X direction, and similarly, the length of the gap between the right-hand portion of the pattern 12A and the pattern 12B is measured. The difference between these two measurements is divided in half, and the resulting value is regarded as the alignment accuracy in the connecting position (where the fields 4 and 6 are connected to each other) with respect to the X direction. Likewise, the length of the gap between the upper portion of the pattern 12A and the pattern 12B is measured with respect to an Y direction, and similarly, the length of the gap between the lower portion of the pattern 12A and the pattern 12B is measured. The difference between these two measurements is divided in half, and the resulting value is regarded as the alignment accuracy in the connecting position (where the fields 4 and 6 are connected to each other) with respect to the Y direction. It is thus possible to quantitatively determine the alignment accuracy in the connecting position with respect to the Y direction.

Figure 4:
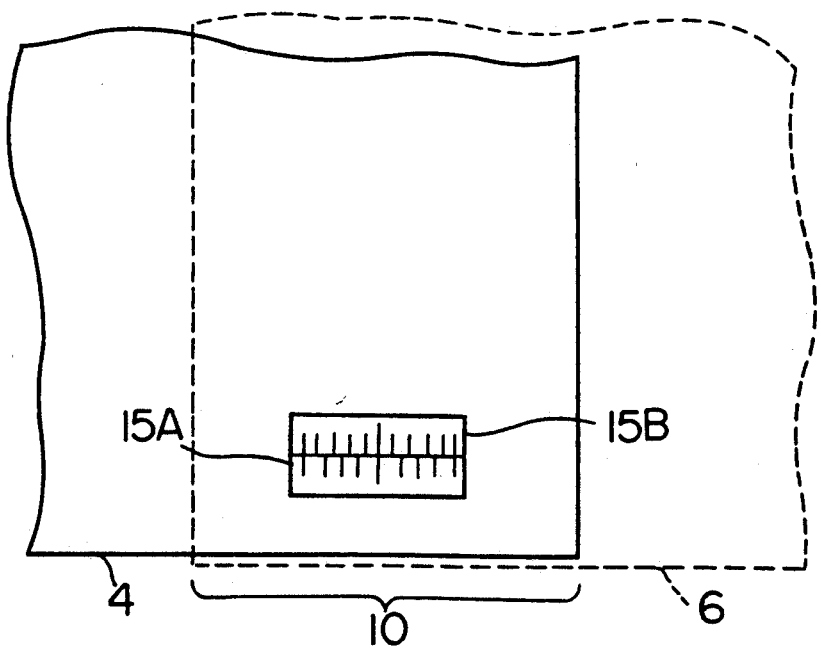
FIGS. 4 to 8 are plan views each showing another example of a checking pattern.
Figure 5:
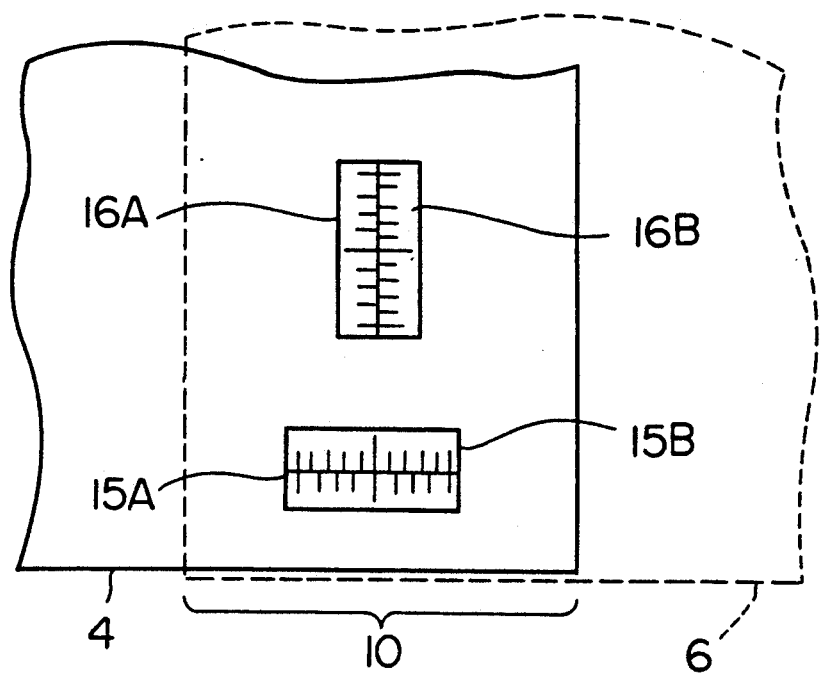

As illustrated in FIG. 4, rectangular checking patterns 15A and 15B, each composed of different graduations, are formed in the fields 4 and 6, respectively, to write a pair of verniers in the overlap portion 10. The alignment accuracy in the connecting position can thus be determined visually and quantitatively. In addition, as shown in FIG. 5, other checking patterns 16A and 16B are formed in the fields 4 and 6, respectively, in a direction at right angles to the checking patterns 15A and 15B. Such construction also makes it possible to determine the alignment accuracy in the connecting position with respect to the X and Y directions in the fields.

Figure 6:
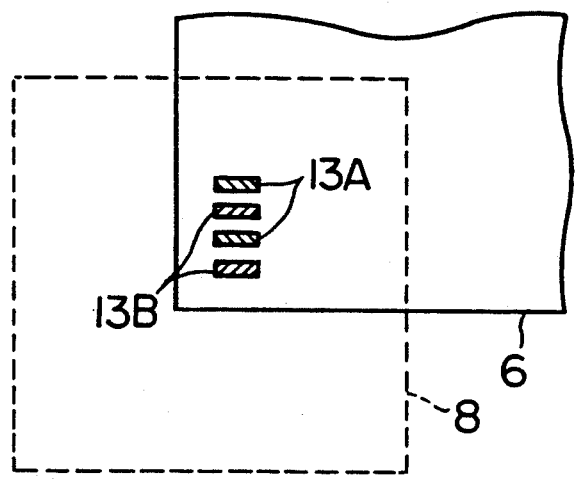

As shown in FIG. 6, a pair of parallel rectangular checking patterns 13A are formed close to the lower left-hand corner of the field 6, and a pair of parallel rectangular checking patterns 13B are formed near the center of the field 8. These checking patterns are positioned alternatively in a portion in which the fields 6 and 8 overlap each other. By measuring the alignment accuracies of the two pairs of patterns 13A and 13B already written, it is possible to determine variations in measurements in the fields attributable to deflection aberration.

Figure 7:
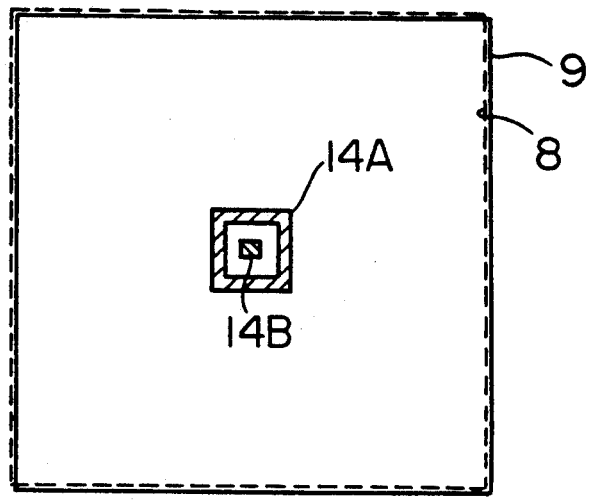

As shown in FIG. 7, a square-like checking pattern 14A may also be formed at the center of the field 8, and a rectangular checking pattern 14B in the field 9, completely overlapped by the field 8, so as to be positioned at the center of the checking pattern 14A. The field 8 is exposed by the first of a series of exposures so as to write the checking pattern 14A. The main pattern and the like are then exposed, and the field 9 is finally exposed to write the checking pattern 14B. The relative positions of the thus-written patterns 14A and 14B are measured in the same manner as that used for the checking patterns 12A and 12B shown in FIG. 3, thus making it possible to determine a drift or the shift of a pattern over a long series of exposures.

Figure 8:
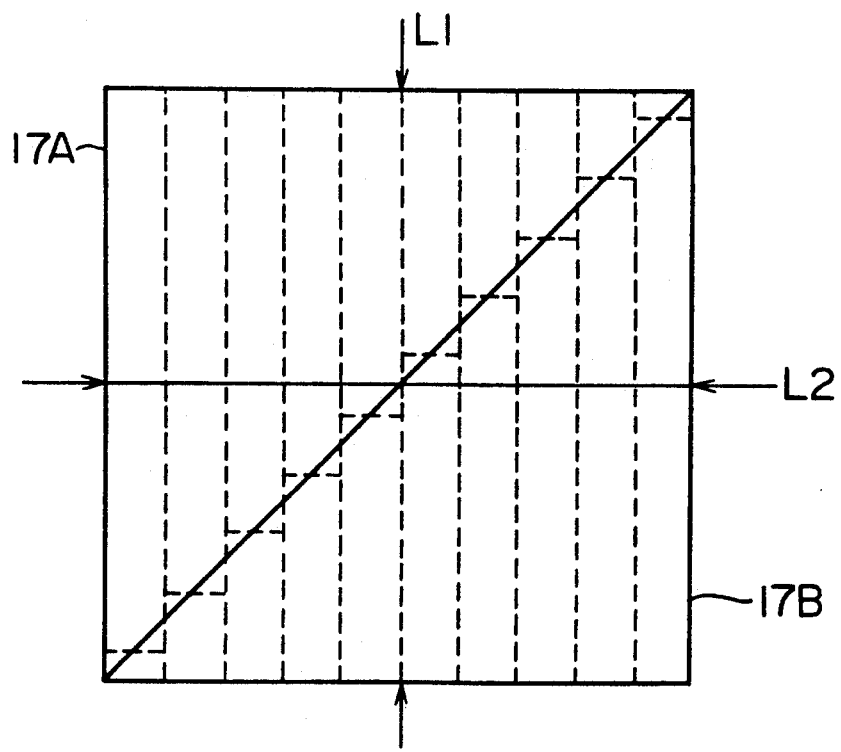
Figure 9:
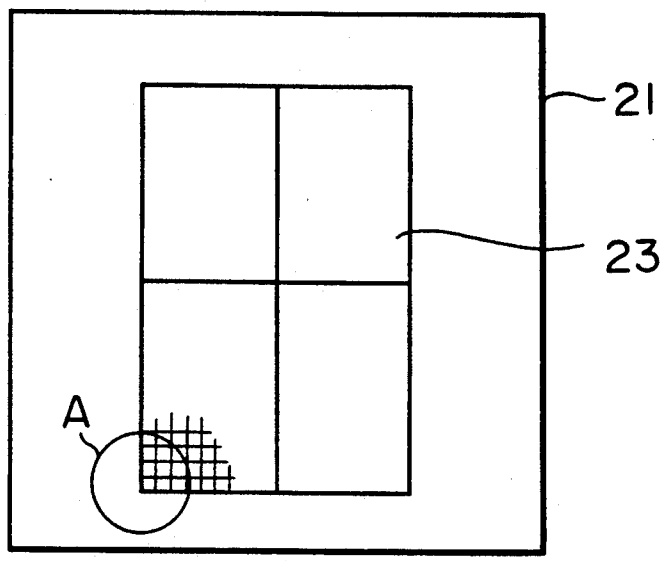
FIG. 9 is a plan view showing the conventional photomask.
Figure 10:
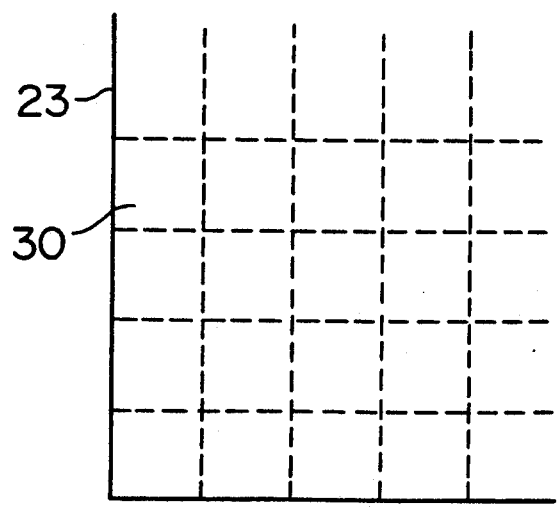
FIG. 10 is an enlarged view showing the part of FIG. 9 indicated by A.
Figure 11:
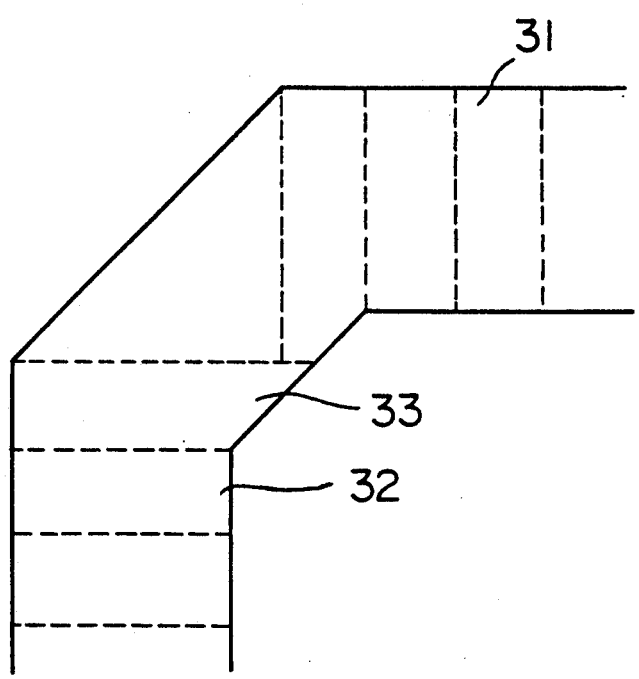
FIG. 11 is a plan view showing how a conventional chip portion is exposed.
Figure 12:
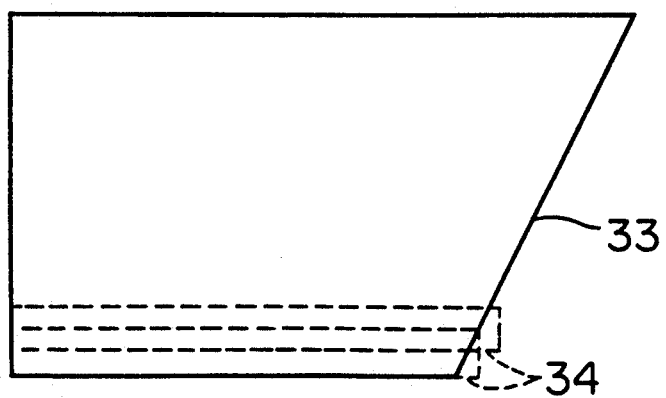
FIG. 12 is a plan view showing how a conventional trapezoidal figure pattern is exposed.

As illustrated in FIG. 8, a triangular or trapezoidal checking pattern 17A is formed in one of the two fields overlapping each other, and another triangular or trapezoidal checking pattern 17B is formed in the other field, checking pattern 17B has an oblique side connected to the oblique side of the pattern 17A. Such formation of the patterns 17A and 17B is effective in multi-sliding exposures of rectangular shots in order to write trapezoidal figures. After the checking patterns 17A and 17B have been written, these patterns are combined into a rectangular pattern. The vertical length L1 of this rectangular pattern and the horizontal length L2 are measured. This measuring operation also makes it possible to determine not only the alignment accuracy in the oblique side portion of a trapezoidal figure to be written, but also the accuracy with which the rectangular shots are laid on top of one another.

The monitor pattern zone 2 is disposed outside the chip portion 3 on the photomask 1 shown in FIG. 1. However, a plurality of the monitor pattern zones 2 may also be arranged so that each monitor pattern zone can be used to determine the writing accuracy more precisely. The monitor pattern zone may also be disposed inside the chip portion 3.

Checking patterns other than those shown in FIGS. 3 to 8 may also be formed in the monitor pattern zone 2, and the same effect as described above can be obtained.

Although the above embodiment has been described for pattern shapes on the photomask 1, if a wafer is used in place of the photomask 1, the method of monitoring accuracy in accordance with this invention may also be applied to directly writing on the wafer.

What is claimed is:

1. A method of monitoring the accuracy with which patterns are written comprising the steps of:

dividing a mask pattern into a chip zone and a monitor zone separate from the chip zone;

disposing in the monitor zone a monitor pattern for monitoring accuracy;

partitioning the monitor pattern into a plurality of overlapping fields;

forming a rectangular annulus and a rectangle in each of two overlapping fields as checking patterns in the monitor pattern, the rectangle being positioned at the center of the rectangular annulus in the monitor pattern where the plurality of fields overlap each other;

exposing an electron beam resist with an electron beam, thereby writing the monitor pattern on the resist; and measuring alignment accuracy in the pattern exposed by the electron beam by inspecting the checking patterns in the exposed overlapping fields.

2. A method of monitoring the accuracy with which patterns are written comprising the steps of:

dividing a mask pattern into a chip zone and a monitor zone separate from the chip zone;

disposing in the monitor zone a monitor pattern for monitoring accuracy;

partitioning the monitor pattern into a plurality of overlapping fields;

forming triangular patterns in each of two overlapping fields as checking patterns in the monitor pattern, an oblique side of one triangular pattern contacting an oblique side of the other triangular pattern to form a rectangular pattern in the monitor pattern where the plurality of fields overlap each other;

exposing an electron beam resist with an electron beam, thereby writing the monitor pattern on the resist; and measuring alignment accuracy in the pattern exposed by the electron beam by inspecting the checking patterns in the exposed overlapping fields.

3. A method of monitoring the accuracy with which patterns are written comprising the steps of:

dividing a mask pattern into a chip zone and a monitor zone separate from the chip zone;

disposing in the monitor zone a monitor pattern for monitoring accuracy;

partitioning the monitor pattern into a plurality of overlapping fields;

forming trapezoidal patterns in each of two overlapping fields as checking patterns in the monitor pattern, an oblique side of one trapezoidal pattern contacting an oblique side of the other trapezoidal pattern to form a rectangular pattern in the monitor pattern where the plurality of fields overlap each other;

exposing an electron beam resist with an electron beam, thereby writing the monitor pattern on the resist; and measuring alignment accuracy in the pattern exposed by the electron beam by inspecting the checking patterns in the exposed overlapping fields.

* * * * *